US012669529B2

(12) United States Patent
Chang

(10) Patent No.: US 12,669,529 B2
(45) Date of Patent: Jun. 30, 2026

(54) EMULATOR SYSTEM AND EMULATING METHOD FOR SATELLITE COMMUNICATION

(71) Applicant: TMY Technology Inc., Taipei City (TW)

(72) Inventor: Su-Wei Chang, Taipei City (TW)

(73) Assignee: TMY Technology Inc., Taipei City (TW)

(*) Notice: Subject to any disclaimer, the term of this patent is extended or adjusted under 35 U.S.C. 154(b) by 299 days.

(21) Appl. No.: 18/537,806

(22) Filed: Dec. 13, 2023

(65) Prior Publication Data

US 2024/0210456 A1    Jun. 27, 2024

Related U.S. Application Data

(60) Provisional application No. 63/435,276, filed on Dec. 26, 2022.

(51) Int. Cl.
| | |
|---|---|
| *H01Q 3/26* | (2006.01) |
| *G01R 29/08* | (2006.01) |
| *G01R 29/10* | (2006.01) |
| *H01Q 3/36* | (2006.01) |

(52) U.S. Cl.
CPC ......... *G01R 29/0871* (2013.01); *G01R 29/10* (2013.01); *H01Q 3/267* (2013.01); *H01Q 3/36* (2013.01)

(58) Field of Classification Search
None
See application file for complete search history.

(56) References Cited

U.S. PATENT DOCUMENTS

| | | | |
|---|---|---|---|
| 9,715,018 B2 | 7/2017 | Bai | |
| 11,056,784 B1 * | 7/2021 | Agon | H04B 17/21 |

(Continued)

FOREIGN PATENT DOCUMENTS

| | | |
|---|---|---|
| CN | 102621560 | 8/2012 |
| CN | 111049600 | 4/2020 |

(Continued)

OTHER PUBLICATIONS

Mostafa Alazab et al., "On-Earth Performance Evaluation of SatCom On-The-Move (SOTM) Terminals", 2013 IEEE Military Communications Conference, Nov. 18, 2013, pp. 634-640.

(Continued)

*Primary Examiner* — Pablo N Tran
(74) *Attorney, Agent, or Firm* — JCIPRNET

(57) ABSTRACT

An emulator system and an emulating method for satellite communication are provided. The emulating method includes: providing a first antenna array, wherein the first antenna array includes a plurality of antenna units arranged along a first direction; mounting the device under test on a virtual plane by a jig; enabling a first beam by the first antenna array; steering the first beam to the device under test by a default angle of incidence; transmitting a first signal to the device under test via the first beam, and receiving a second signal corresponding to the first signal from the device under test; calculating a value of phase difference according to the second signal; determining whether the device under test passes a test according to the value of phase difference and a threshold to generate a testing result; and outputting the testing result.

20 Claims, 9 Drawing Sheets providing a first antenna array, wherein the first antenna array comprises a plurality of antenna units arranged along a first direction — S901 mounting the device under test on a virtual plane by a jig — S902 enabling a first beam by the first antenna array — S903 steering the first beam to the device under test by a default angle of incidence — S904 transmitting a first signal to the device under test via the first beam, and receiving a second signal corresponding to the first signal from the device under test — S905 calculating a value of phase difference according to the second signal — S906 determining whether the device under test passes a test according to the value of phase difference and a threshold to generate a testing result — S907 outputting the testing result — S908

(56) References Cited

U.S. PATENT DOCUMENTS

| | | | |
|---|---|---|---|
| 11,408,993 B2 * | 8/2022 | Lee | G01S 13/89 |
| 11,867,832 B2 * | 1/2024 | Vanwiggeren | G01S 13/931 |
| 12,314,638 B2 * | 5/2025 | Santarone | G01S 19/48 |
| 2014/0225773 A1 | 8/2014 | Boulton | |
| 2018/0076906 A1 | 3/2018 | Naseef et al. | |
| 2018/0337738 A1 | 11/2018 | Wen et al. | |
| 2020/0313725 A1 | 10/2020 | Abdulai et al. | |
| 2021/0344400 A1 * | 11/2021 | Gupta | H04L 25/03891 |
| 2025/0183530 A1 * | 6/2025 | Han | H01Q 21/065 |
| 2025/0224476 A1 * | 7/2025 | Gallyas Sanhueza | G01S 3/38 |
| 2025/0244461 A1 * | 7/2025 | Hirzallah | G01S 13/46 |

FOREIGN PATENT DOCUMENTS

| | | |
|---|---|---|
| CN | 113411149 | 9/2021 |
| CN | 115755107 | 3/2023 |
| JP | 2019515288 | 6/2019 |
| JP | 2021119344 | 8/2021 |
| WO | 2022118403 | 6/2022 |

OTHER PUBLICATIONS

M. A. Salas Natera et al., "Design of an Adaptive Antenna Array Test-Bed based on Software Radio for Tracking LEO Satellites", The Second European Conference on Antennas and Propagation, EuCAP 2007, Nov. 11, 2007, pp. 1-6.

"Search Report of Europe Counterpart Application", issued on May 24, 2024, p. 1-p. 9.

"Office Action of Japan Counterpart Application", issued on Mar. 5, 2025, p. 1-p. 3.

"Office Action of Taiwan Counterpart Application", issued on Dec. 6, 2024, p. 1-p. 14.

* cited by examiner

700

800

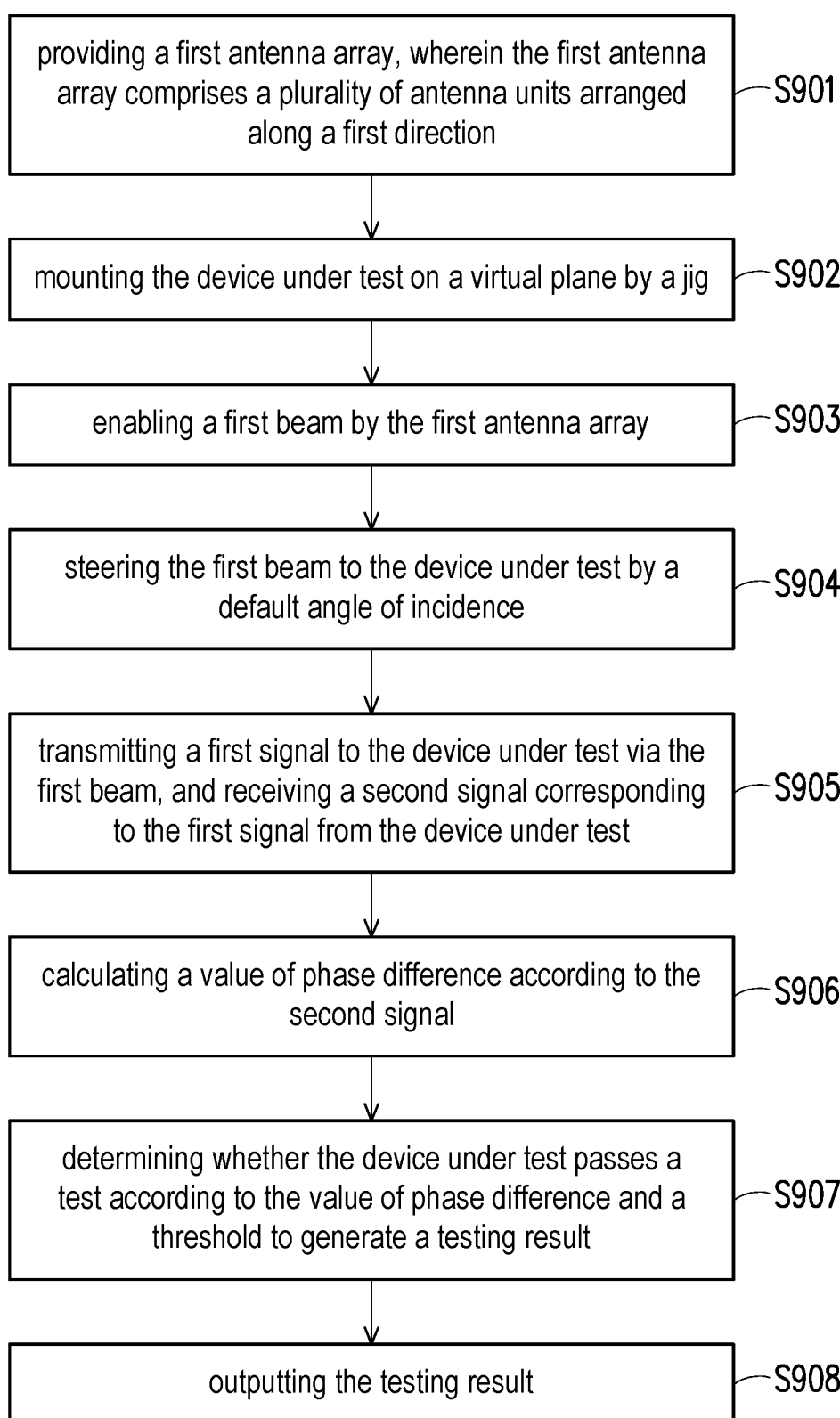

providing a first antenna array, wherein the first antenna array comprises a plurality of antenna units arranged along a first direction ⌐S901 mounting the device under test on a virtual plane by a jig ⌐S902 enabling a first beam by the first antenna array ⌐S903 steering the first beam to the device under test by a default angle of incidence ⌐S904 transmitting a first signal to the device under test via the first beam, and receiving a second signal corresponding to the first signal from the device under test ⌐S905 calculating a value of phase difference according to the second signal ⌐S906 determining whether the device under test passes a test according to the value of phase difference and a threshold to generate a testing result ⌐S907 outputting the testing result ⌐S908

FIG. 9

EMULATOR SYSTEM AND EMULATING METHOD FOR SATELLITE COMMUNICATION

CROSS-REFERENCE TO RELATED APPLICATION

This application claims the priority benefit of U.S. provisional Patent Application Ser. No. 63/435,276, filed on Dec. 26, 2022. The entirety of the above-mentioned patent application is hereby incorporated by reference herein and made a part of this specification.

BACKGROUND

Technical Field

The disclosure relates to a method for wireless communication, and particularly relates an emulator system and an emulating method for satellite communication.

Description of Related Art

The low-earth satellite (LEO) system is launching now. The devices on earth may be able to communicate with each other regardless the distance therebetween because of the LEO system. However, it is important to ensure that the devices in the market operate normally, i.e., capable of communicating with a LEO satellite.

SUMMARY

The disclosure is directed to an emulator system and an emulating method for satellite communication, and the disclosure is suitable for a device under test (DUT).

The present invention is directed to an emulator system for satellite communication. The emulator system is suitable for a device under test. The emulator system includes a first antenna array, a jig, and a controller. The first antenna array including a plurality of antenna units arranged along a first direction. The jig is for mounting the device under test on a virtual plane. The controller, communicatively connected to the first antenna array, wherein the controller is configured to: enable a first beam by the first antenna array; steer the first beam to the device under test by a default angle of incidence; transmit a first signal to the device under test via the first beam, and receive a second signal corresponding to the first signal from the device under test; calculate a value of phase difference according to the second signal; determine whether the device under test passes a test according to the value of phase difference and a threshold to generate a testing result; and output the testing result.

In one embodiment of present invention, a projection of the first antenna array on the virtual plane overlaps with the jig.

In one embodiment of present invention, a projection of the first antenna array on the virtual plane does not overlaps with the jig.

In one embodiment of present invention, the controller enables a second beam different from the first beam by the first antenna array, and communicates with the device under test via the second beam to generate the testing result.

In one embodiment of present invention, the emulator system further including a second antenna array. The second antenna array includes a plurality of antenna units arranged along a second direction, wherein the second antenna array communicatively connected to the controller, wherein the controller enables the first beam by the first antenna array and the second antenna array.

In one embodiment of present invention, the emulator system further including a second antenna array. The second antenna array includes a plurality of antenna units arranged along a second direction, wherein the second antenna array communicatively connected to the controller, wherein the controller enables a second beam by the second antenna array, and communicates with the device under test via the second beam to generate the testing result.

In one embodiment of present invention, the first antenna array further including a phase shifter electrically connected to a first antenna unit of the plurality of antenna units, wherein the controller performs a phase shifting on the second signal by the phase shifter to obtain a shifted signal, and calculates the value of phase difference according to the shifted signal.

In one embodiment of present invention, the controller further configured to: receive a calibration signal from the device under test; and compensate the shifted signal according to the calibration signal to calculate the value of phase difference.

In one embodiment of present invention, the controller adjusts a mocked-height of an emulated satellite of the satellite communication by adjusting a signal strength of the first beam.

In one embodiment of present invention, the controller adjusts a mocked angle of incidence by adjusting the default angle of incidence based on the mocked-height.

In one embodiment of present invention, the jig is a movable object and is electrically connected to the controller, wherein the controller configures the jig to make the virtual plane has six degrees of freedom.

The present invention is directed to an emulating method for satellite communication. The emulating method is suitable for a device under test. The emulating method includes: providing a first antenna array, wherein the first antenna array includes a plurality of antenna units arranged along a first direction; mounting the device under test on a virtual plane by a jig: enabling a first beam by the first antenna array; steering the first beam to the device under test by a default angle of incidence; transmitting a first signal to the device under test via the first beam, and receiving a second signal corresponding to the first signal from the device under test; calculating a value of phase difference according to the second signal; determining whether the device under test passes a test according to the value of phase difference and a threshold to generate a testing result; and outputting the testing result.

In one embodiment of present invention, a projection of the first antenna array on the virtual plane overlaps with the jig.

In one embodiment of present invention, a projection of the first antenna array on the virtual plane does not overlaps with the jig.

In one embodiment of present invention, the emulating method further including: enabling a second beam different from the first beam by the first antenna array; and communicating with the device under test via the second beam to generate the testing result.

In one embodiment of present invention, the emulating method further including: providing a second antenna array, wherein the second antenna array includes a plurality of antenna units arranged along a second direction, wherein the step of enabling the first beam by the first antenna array including: enabling the first beam by the first antenna array and the second antenna array.

In one embodiment of present invention, the emulating method further including: providing a second antenna array, wherein the second antenna array includes a plurality of antenna units arranged along a second direction, wherein the step of generating the testing result including: enabling a second beam by the second antenna array; and communicating with the device under test via the second beam to generate the testing result.

In one embodiment of present invention, the step of calculating the value of phase difference according to the second signal including: performing a phase shifting on the second signal to obtain a shifted signal; and calculating the value of phase difference according to the shifted signal.

In one embodiment of present invention, the step of calculating the value of phase difference according to the shifted signal including: receiving a calibration signal from the device under test; and compensating the shifted signal according to the calibration signal to calculate the value of phase difference.

In one embodiment of present invention, the emulating method further including: adjusting a mocked-height of an emulated satellite of the satellite communication by adjusting a signal strength of the first beam.

Based on the above description, the disclosure provides a convenience way for testing the communicating capability of a satellite communication device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 9 illustrates a flowchart of an emulating method for satellite communication according to one embodiment of the present disclosure.

DESCRIPTION OF THE EMBODIMENTS

Figure 1:
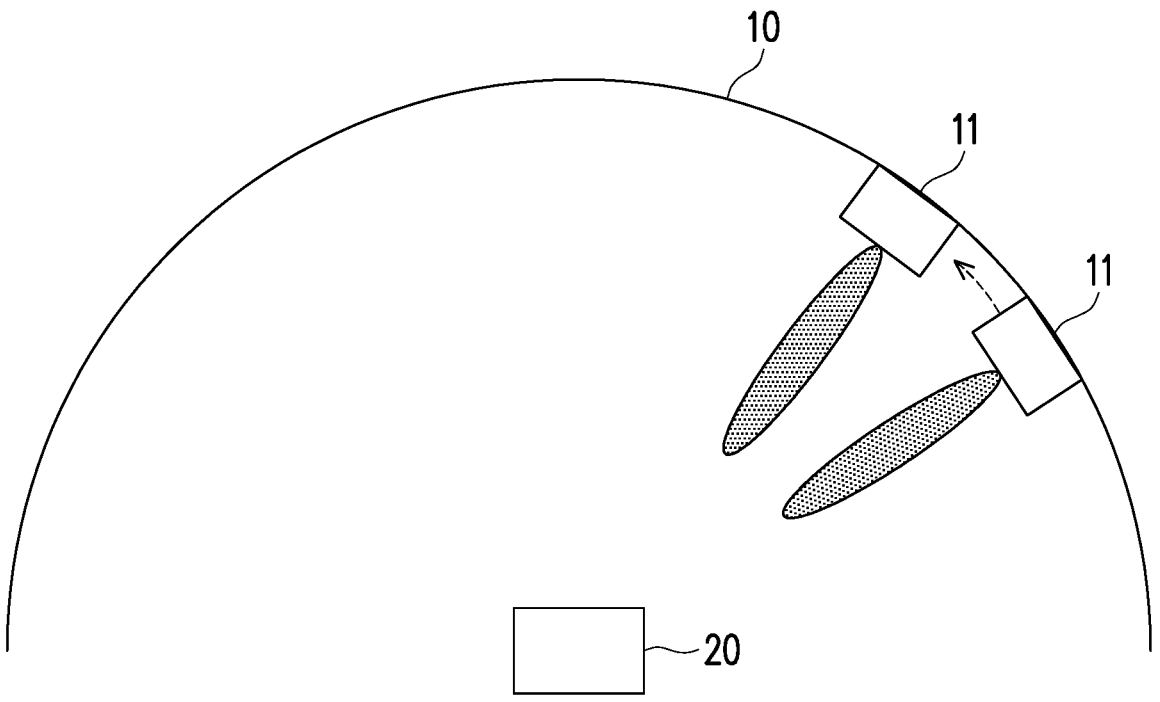
FIG. 1 illustrates a schematic diagram of an emulating environment of satellite communication.

FIG. 1 illustrates a schematic diagram of an emulating environment of satellite communication. A conventional emulating environment has an arc type rail 10 for mounting a device 11 acting as an emulated satellite, wherein the device 11 may be moved along the arc type rail 10. A DUT 20 may be tested on a mounting platform. However, the metal frame of the arc type rail 10 may influence the test result and the mechanical controlling means has some drawbacks such as low precision, complicated mechanical structure, time for installation as well as calibration, etc.

Figure 2:
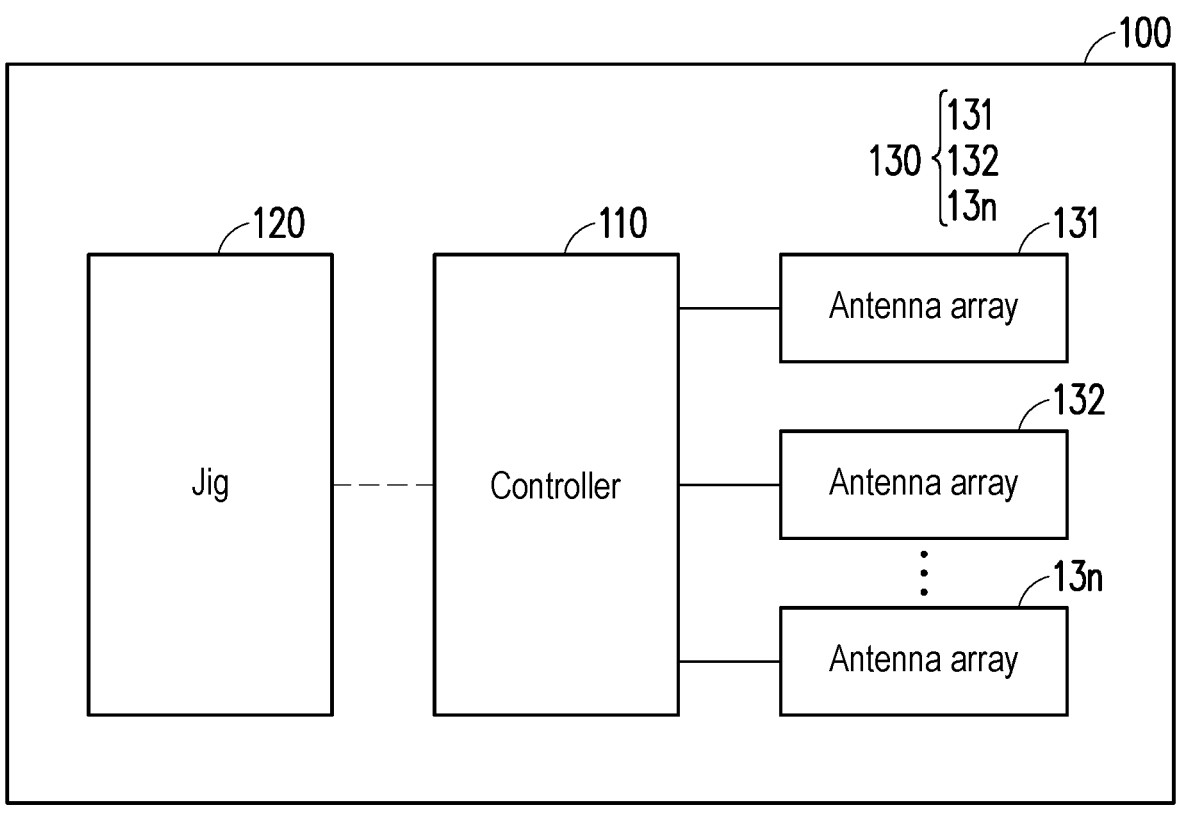
FIG. 2 illustrates a schematic diagram of an emulator system for satellite communication according to one embodiment of the present disclosure.
Figure 3:
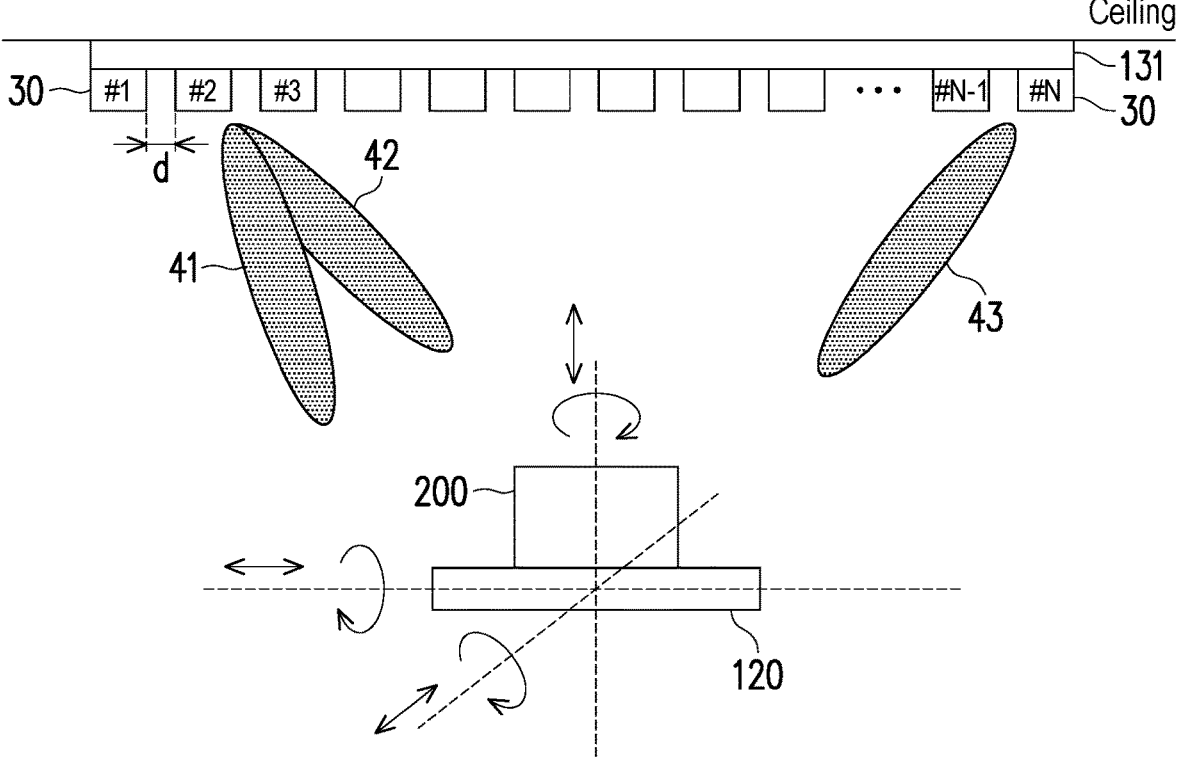
FIG. 3 illustrates a side view diagram of an emulating environment of satellite communication according to one embodiment of the present disclosure.

FIG. 2 illustrates a schematic diagram of an emulator system 100 for satellite communication according to one embodiment of the present disclosure. FIG. 3 illustrates a side view diagram of an emulating environment of satellite communication according to one embodiment of the present disclosure. The emulator system 100 is suitable for testing the communication capability of a DUT 200. The emulator system 100 may include a controller 110, a jig 120, and one or more antenna arrays 130. The number of the antenna array 130 of the emulator system 100 may be any positive integer, the disclosure is not limited thereto. For example, the antenna arrays 130 may include an antenna array 131, an antenna array 132, and an antenna array 13n.

The controller 110 may be, for example, a central processing unit (CPU), or other programmable general purpose or special purpose micro control unit (MCU), a microprocessor, a digital signal processor (DSP), a programmable controller, an application specific integrated circuit (ASIC), a graphics processing unit (GPU), an arithmetic logic unit (ALU), a complex programmable logic device (CPLD), a field programmable gate array (FPGA), or other similar device or a combination of the above devices. The controller 110 may communicatively or electrically connected to the jig 120 or one or more antenna arrays 130.

The jig 120 may be used to mount the DUT 200 on a virtual plane, wherein the virtual plane may be, for example, a plane parallel with a desktop or a platform. For example, the jig 120 may be disposed on a desktop and may fix a DUT 200 on the desktop. In one embodiment, the jig 120 may be a movable object (e.g., a lifting platform) and may electrically or communicatively connected to the controller 110. The controller 110 may configure the jig 120 to make the virtual plane has six degrees of freedom, as shown in FIG. 3. The DUT 200 may move with the jig 120 so as to simulate the situation when a communication device of the satellite communication system is moving.

The antenna array 130 (e.g., antenna array 131) may be a uniform linear array (ULA) and may comprise N antenna units 30 arranged along a specific direction, wherein N may be any positive integer. The two adjacent antenna units 30 (e.g., antenna unit #1 and #2) may be separated by a length d. In one embodiment, the length d may equal to $\lambda/2$, wherein $\lambda$ may be wavelength of the testing signal emitting by the antenna array 130 or the DUT 200.

A single antenna array 130 may enable one or more beams and may steer the one or more beams to the DUT 200 so as to communicate with the DUT 200 via the one or more beams, wherein the controller 110 may emulate the movement of an emulated satellite by adjusting the angle of the one or more beams. The controller 110 may communicate with the DUT 200 via the one or more beams to test the DUT 200. By tuning the phase of each of enabled antenna units 30, the beam direction may be controlled by the controller 110. By adjusting the gain of each of enabled antenna units 30, the total gain and/or beam-shape may be adjusted. Furthermore, the angular speed (relative to the DUT 200) of the central of the enabled antenna units 30 may be equivalent to the angular speed of the emulated satellite.

In one embodiment, the controller 110 may enable a plurality of beams to emulate a plurality of emulated satellites respectively. Each beams may be enabling by the (kn+m)th antenna unit 30 of the antenna array 130, wherein k and n are positive integers while m is a non-negative integer less than k. Taking the antenna array 131 as an example, three antenna units 30 (i.e., antenna units #1, #2, and #3) of the antenna array 131 may enable beam 41 and beam 42 at the same time or at different times, and the three antenna units 30 may steer beam 41 or beam 42 to the DUT 200. On the other hand, two antenna units 30 (i.e., antenna units #(N−1) and #N) of the antenna array 131 may enable beam 43 and may steer beam 43 to the DUT 200.

Figure 4:
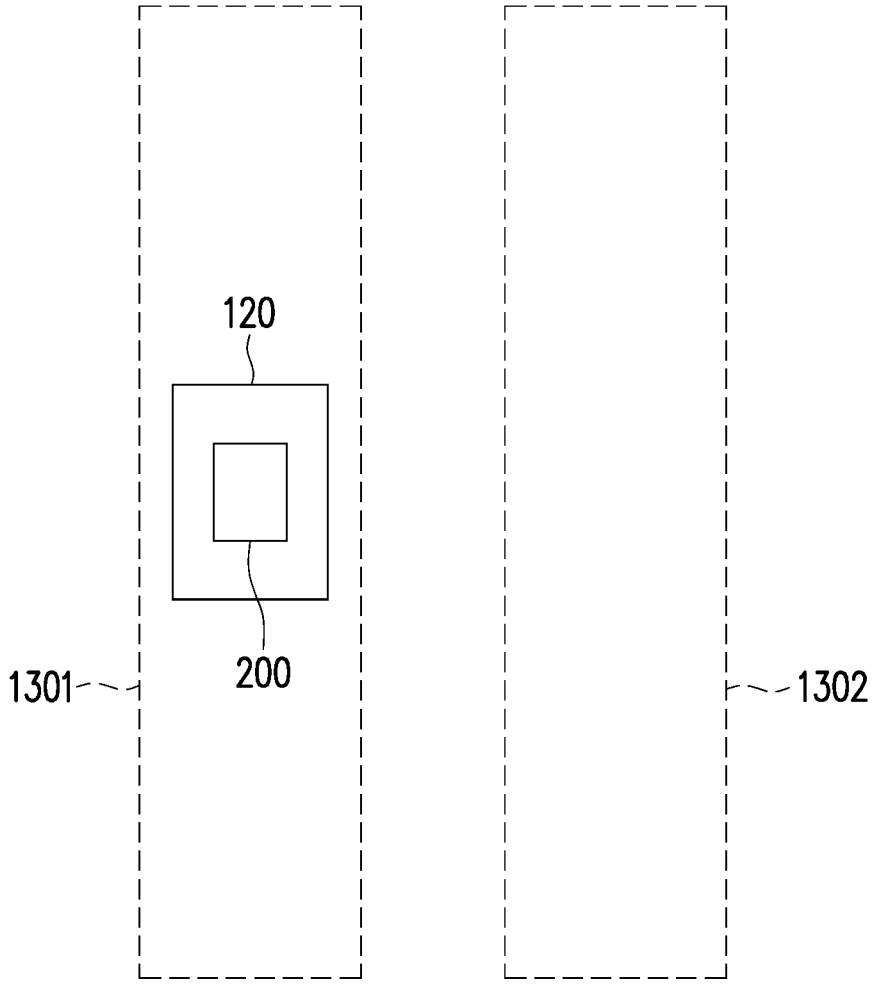
FIG. 4 illustrates a top view diagram of an emulating environment of satellite communication according to one embodiment of the present disclosure.

One or more antenna arrays 130 may be installed, for example, on a ceiling, and the multiple antenna units 30 of different antenna array 130 may be arranged along the same or different directions so as to emulate the satellites with the same or different orbits. FIG. 4 illustrates a top view diagram of an emulating environment of satellite communication according to one embodiment of the present disclosure. Taking the antenna array 131 as an example, a projection 1301 of the antenna array 131 on the virtual plane (e.g., a desktop) which the DUT 200 mounted on may completely/partially overlap with the jig 120 or the DUT 200. Taking the antenna array 132 as an example, a projection 1302 of the antenna array 132 on the virtual plane which the DUT 200 mounted on may not overlap with the jig 120 or the DUT 200. Accordingly, the antenna array 131 and the antenna array 132 may be used to respectively emulate satellites with different angle of incidences.

Figure 5:
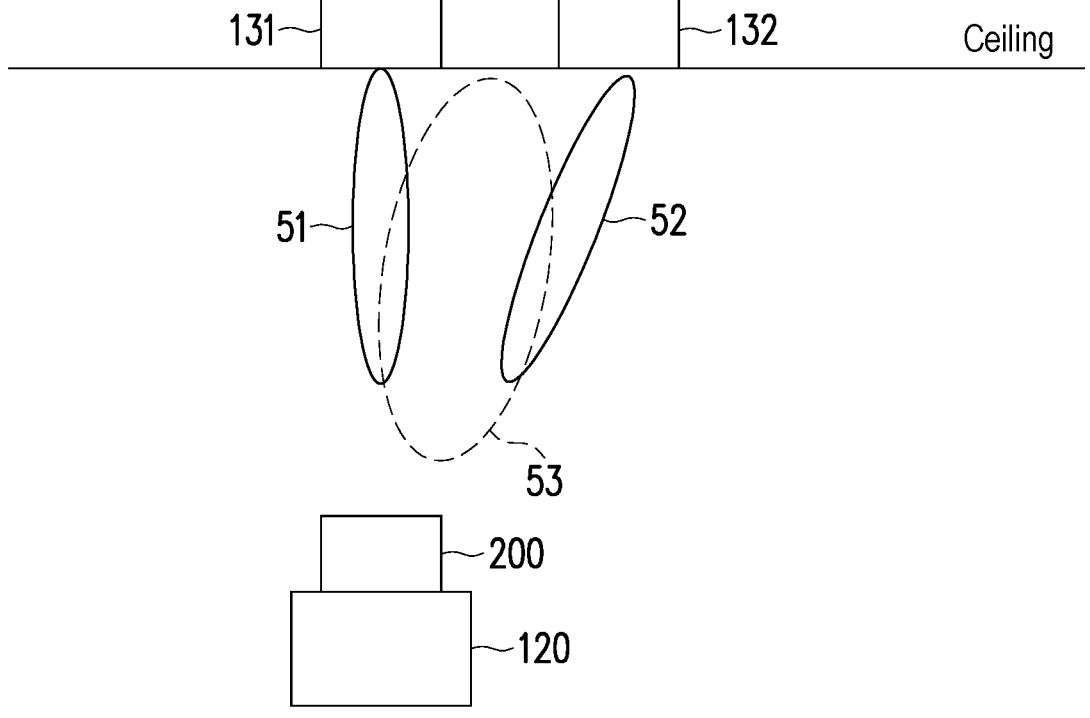
FIG. 5 illustrates a side view diagram of an emulating environment of satellite communication according to one embodiment of the present disclosure.

FIG. 5 illustrates a side view diagram of an emulating environment of satellite communication according to one embodiment of the present disclosure. In one embodiment, the different antenna arrays 130 may respectively enable different beams for communicating with the DUT 200. For example, the antenna array 131 may enable beam 51 and the antenna array 132 may enable beam 52. The controller 110 may communicate with the DUT 200 via beam 51 and/or beam 52 to test the DUT 200 and generate a testing result of the DUT 200. In one embodiment, a beam may be enabled by multiple antenna arrays 130. For example, beam 53 may be enabled by the antenna array 131 and the antenna array 132. The controller 110 may communicate with the DUT 200 via beam 53 to test the DUT 200 and generate a testing result of the DUT 200.

Figure 6:
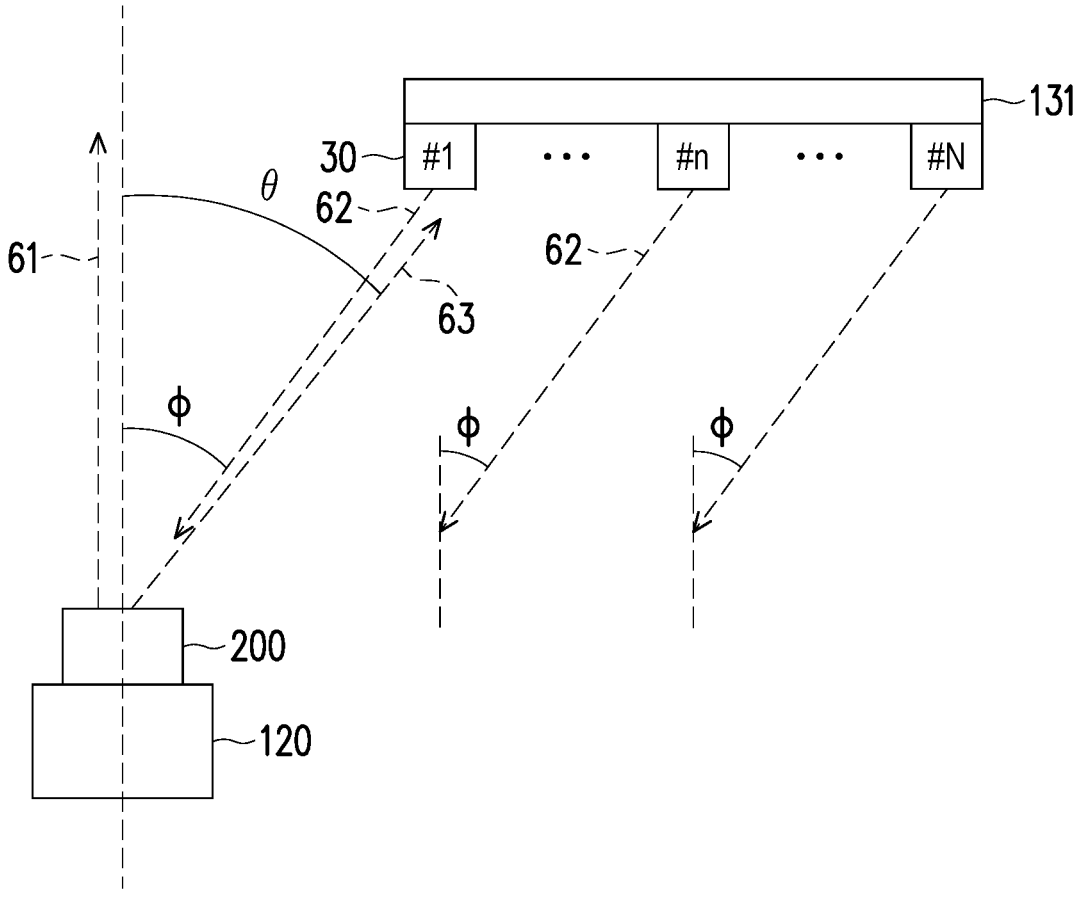
FIG. 6 illustrates a schematic diagram the communication between the antenna array and the DUT according to one embodiment of the present disclosure.

FIG. 6 illustrates a schematic diagram the communication between the antenna array 131 and the DUT 200 according to one embodiment of the present disclosure. In order to test the DUT 200, the DUT 200 may first transmit a calibration signal 61 with a 0-degree steering angle. That is, the calibration signal 61 may be transmitted by the DUT 200 along a vertical line passing through the DUT 200. The antenna array 131 may receive the calibration signal 61 and the controller 110 may record the information of the calibration signal 61.

After that, the controller 110 may enable a beam 62 by the antenna array 131 and may steer the beam 62 to the DUT 200 by a default angle of incidence $\phi$. The controller 110 may transmit a signal to the DUT 200 via the beam 62, and the DUT 200 may receive the signal from the beam 62 and obtain an angle or arrival (AoA) of the signal. The DUT 200 may emit a response signal 63 with a steering angle $\theta$ (i.e., angle between the direction of the response signal 63 and the vertical line passing through the DUT 200) same as the AoA. If the DUT 200 may calculate the AoA correctly, the AoA or the steering angle $\theta$ should equal to the default angle of incidence $\phi$. Therefore, if the AoA or the steering angle $\theta$ is not equal to the default angle of incidence $\phi$, it means that the phase shifting mechanism of the DUT 200 may has some error. However, due to the nature of the wireless signal having a beam width, the one or more antenna units 30 of the antenna array 131 may still receive the response signal 63 emitted by the DUT 200. It is important to determine whether the DUT 200 is capable of correctly calculating the AoA as well as correctly transmitting the response signal 63 toward the source of the received signal (e.g., antenna array 131).

It is assumed that the antenna array 131 is a uniform learn array, the two adjacent antenna units 30 of the antenna array 131 is separated by a length d=λ/2, and the steering angle $\theta$ of the signal 63 is directed to the first antenna unit 30 (i.e., antenna unit #1). The phase $\theta_n$ of the received response signal 63 of the nth (from left to right) antenna unit 30 may be given as equation (1).

$$\theta_n = \left[ -(n-1)\frac{\lambda}{2}\sin\theta \right]\frac{2\pi}{\lambda} = (1-n)\pi\sin\theta, n = 1, 2, \ldots, N \qquad (1)$$

If an antenna unit 30 (e.g., antenna unit #1) receiving the response signal 63 is just located at the position corresponding to the steering angle $\theta$, the antenna unit 30 may receive the signal 63 with planar wave front. On the other hand, if the antenna unit 30 receiving the response signal 63 is at the position corresponding to the default angle of incidence $\phi$ which is not equal to steering angle $\theta$ (e.g., the DUT 200 cannot calculate the AoA completely correctly such that the AoA is not equal to the default angle of incidence $\phi$), the response signal 63 observe by the nth antenna unit 30 may be $P_n$ as shown in equation (2), wherein L is the length of the path from the emitting array of the DUT 200 to the antenna array 131.

$$P_n = \sum_{k=1}^{N} \cos\left(\frac{2\pi L}{\lambda} + (n-1)\pi\sin\phi + (1-k)\pi(\sin\theta - \sin\phi)\right) \qquad (2)$$

In one embodiment, the antenna array 130 (e.g., antenna array 131) may further include a phase shift for each antenna unit 30. A phase shifter may electrically connect to an antenna unit 30. The controller 110 may perform a phase shifting on the signal $P_n$ by the phase shifter to cancel the phase residual $\phi$. The controller 110 may obtain a shifted signal $$P'_n$$

as shown in equation (3) accordingly.

$$P'_n = \sum_{k=1}^{N} \cos\left(\frac{2\pi L}{\lambda} + (1-k)\pi(\sin\theta - \sin\phi)\right) \qquad (3)$$

Since the calibration signal 61 with 0-degree steering angle was received by the nth antenna unit 30, the controller 110 may obtain the value of $$\sum_{k=1}^{N} \cos((k-1)\pi(\sin\phi)).$$

7                                                                          8

When the emitting array of the DUT 200 is operating to have the response signal 63 with steering angle θ, the controller 110 may calculate the value of $$\sum_{k=1}^{N} \cos((1-k)\pi(\sin\theta - \sin\phi))$$

by compensating the shifted signal $$P'_n$$

according to the observed calibration signal 63. If the value of $$\sum_{k=1}^{N} \cos((1-k)\pi(\sin\theta - \sin\phi))$$

is not equal to zero, the controller 110 may calculate a value of phase different between the default angle of incidence φ and the steering angle θ, i.e., the controller 110 may calculate the error between φ and θ. In one embodiment the controller 110 may determine whether the DUT 200 passes a test according to the value of phase different between φ and θ and a threshold. The value of phase different being greater than the threshold means that the DUT 200 cannot calculate the AoA according to the signal 61 correctly. The controller 110 may determine that the DUT 200 did not pass the test and may generate a testing result accordingly. The value of phase different being less than or equal to the threshold means that the capability of the DUT 200 to detect the AoA is acceptable. The controller 110 may determine that the DUT 200 did pass the test and may generate a testing result accordingly. The controller 110 may output the testing result for user reference.

In one embodiment, the controller 110 may adjust a mocked-height of an emulated satellite of the satellite communication by adjusting the gain of the antenna unit 30 of the antenna array 130 or by adjusting the signal strength of the beam emitted by the antenna array 130. The mapping relationship between the mocked-height of the emulated satellite and the signal strength of the emitted beam (or gain of the antenna unit 30) may be record on a lookup table and the controller 110 may pre-store the lookup table.

In one embodiment, the controller 110 may adjust a mocked velocity of the emulated satellite by adjusting the mocked-height of the emulated satellite. Specifically, the controller 110 may obtain a distance R between the emulated satellite and the center of the Earth based on the mocked-height. The controller 110 may obtain the velocity v of the emulated satellite based on equation (4) to equation (6), wherein G is the universal gravitational constant, M is the mass of the Earth, and $R_0$ is the radius of the Earth.

$$g = 9.8\,\text{m/s}^2 = GM/R_0^2 \qquad (4)$$

$$\frac{v^2}{R} = \frac{GM}{R^2} \qquad (5)$$

$$v = \sqrt{\frac{GM}{R}} = R_0\sqrt{\frac{g}{R}} \qquad (6)$$

In one embodiment, the controller 110 may adjust mocked angle of incident of the emulated satellite by adjusting the default angle of incidence φ of the antenna array 130 based on the mocked-height of the emulated satellite. Specifically, the controller 110 may obtain a distance R between the emulated satellite and the center of the Earth based on the mocked-height. Then, the controller 110 may adjust the default angle of incidence φ(t) of the antenna array 130 to emulate an emulated satellite with a mocked angle of incidence φ'(t) and a mocked angular velocity $\omega_e(\phi'(t))$ observed by the device under test 200, as shown in equation (7) and equation (8) respectively, wherein $R_0$ is the radius of the Earth, and $\omega_0$ is the angular velocity of the satellite observed from the center of earth.

$$\phi'(t) = \tan^{-1}\frac{R\sin\phi(t)}{R\cos\phi(t) - R_0} \qquad (7)$$

$$\omega_e(\phi'(t)) = \frac{\partial\phi'(t)}{\partial t} = \left(1 + \cos(\phi'(t))^2\frac{R_0}{R\cos\phi(t) - R_0}\right)\omega_0 \qquad (8)$$

Figure 7:
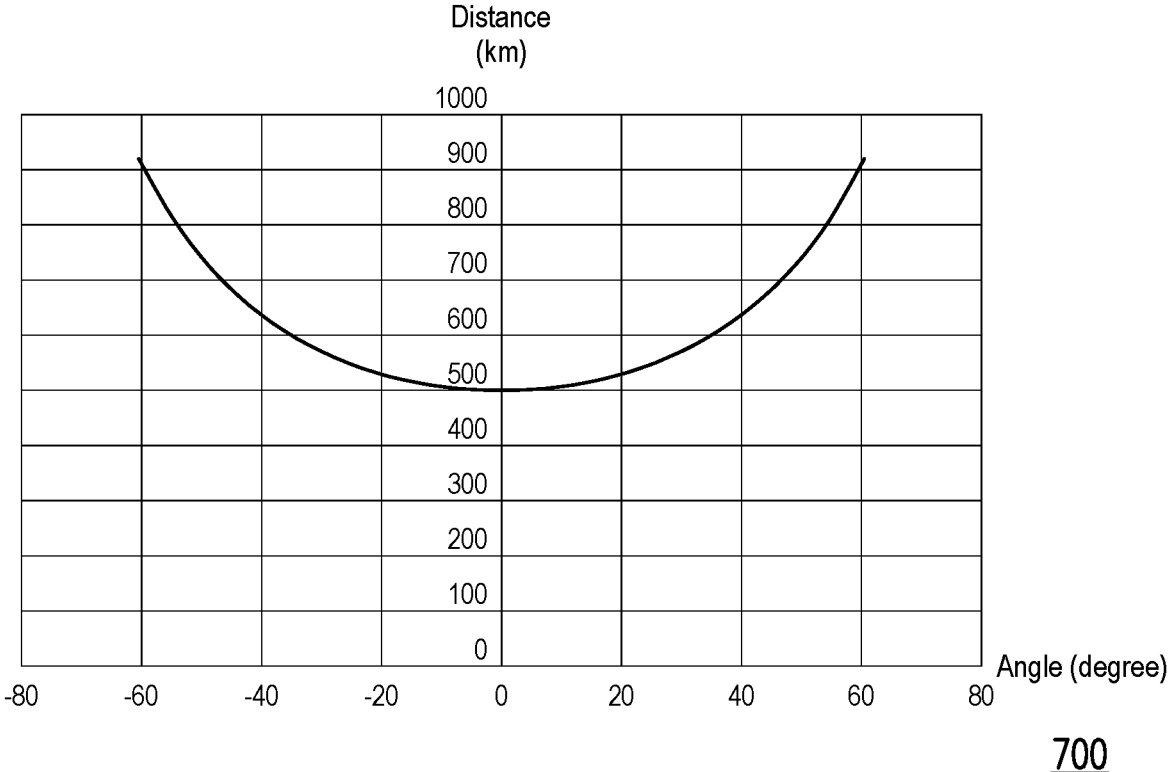
FIG. 7 illustrates a schematic diagram of the relationship between the mocked angle of incidence and a distance according to one embodiment of the present disclosure.

In one embodiment, the controller 110 may adjust the mocked angular velocity $\omega_e$ based on the mocked angle of incidence φ'(t) or may adjust the mocked angle of incidence φ'(t) based on the mocked angular velocity $\omega_e$, as shown in equation (9), wherein $\omega_{e,max}$, the maximum value of the mocked angular velocity $\omega_e$ and k is coefficient that changes with the mocked-height of the emulated satellite. FIG. 7 illustrates a schematic diagram 700 of the relationship between the mocked angle of incidence φ' and a distance according to one embodiment of the present disclosure, wherein said distance is a mocked distance between the emulated satellite and the DUT 200. In one example, assume that the emulated satellite passes directly above the DUT 200 and the mocked-height of the emulated satellite is 500 km (i.e., the minimum mocked distance between the emulated satellite and the DUT 200 is 500 km and the mocked angle of incidence φ' is zero). The coefficient k may be set to 5/3 by the controller 110 based on, for example, a lookup table pre-stored by the controller 110, wherein the lookup table may include relationships among the mocked angle of incidence φ', the mocked distance between the emulated satellite and the DUT 200, and the coefficient k. It should be noted that, although it is assumed that the mocked angle of incidence φ' is zero in the example mentioned above, the present disclosure is not limited thereto. The emulation regarding putting the emulated satellite in other orbital relative position only involve a transmission of spherical coordinates. Those skilled in the art may expand the emulation based on user's requirement in accordance with the teaching of the present disclosure.

$$\omega_e = \omega_{e,max} \times \cos(\phi')^k \qquad (9)$$

Equation (9) is an approximate equation, and the error between the equation (9) and the original equation is less than 4% which is deemed acceptable in engineering practice.

Figure 8:
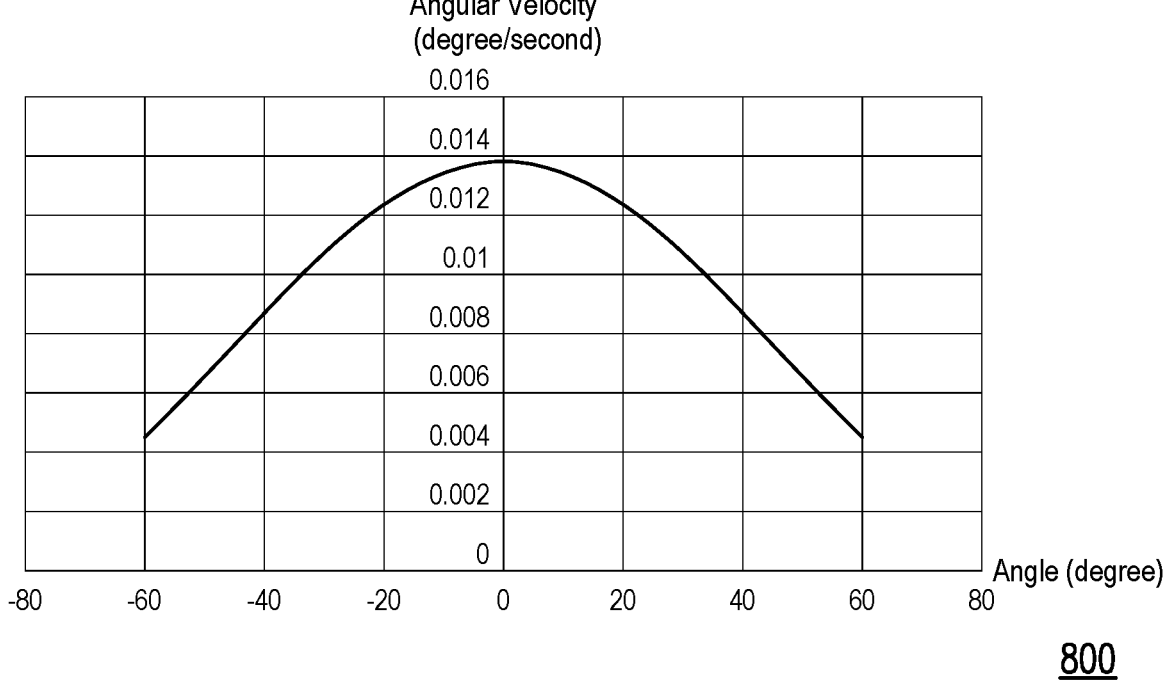
FIG. 8 illustrates a schematic diagram of the relationship between the mocked angle of incidence and the mocked angular velocity of the emulated satellite according to one embodiment of the present disclosure.

In one embodiment, the controller 110 may the mocked distance between the emulated satellite and the DUT 200 based on the mocked angle of incidence φ' or may adjust the mocked angle of incidence φ' based on the mocked distance, as shown in equation (10), wherein R is the distance between the emulated satellite and the center of the Earth, $R_0$ is the radius of the Earth, D is the distance between the emulated satellite and the DUT 200, and m is a coefficient that changes with the mocked-height of the emulated satellite. FIG. 8 illustrates a schematic diagram 800 of the relationship between the mocked angle of incidence φ' and the mocked angular velocity $\omega_e$ of the emulated satellite according to one embodiment of the present disclosure. In one example, assume that the emulated satellite pass directly above the DUT and the mocked-height of the emulated satellite is 500 km (i.e., the minimum mocked distance between the emulated satellite and the DUT 200 is 500 km and the mocked angle of incidence φ' is zero). The coefficient m may be set to 0.86 by the controller 110 based on, for example, a lookup table pre-stored by the controller 110, wherein the lookup table may include relationships among the mocked angle of incidence φ', the mocked angular velocity $\omega_e$ of the satellite, and the coefficient k. It should be noted that, although it is assumed that the mocked angle of incidence φ' is zero in the example mentioned above, the present disclosure is not limited thereto. The emulation regarding putting the emulated satellite in other orbital relative position only involve a transmission of spherical coordinates. Those skilled in the art may expand the emulation based on user's requirement in accordance with the teaching of the present disclosure.

$$D(\phi') = (R - R_0)(\sec \phi')^m \qquad (10)$$

Equation (10) is an approximate equation for D=R·sin φ·csc φ', and the error between the two equations is less than 1.4% which is deemed acceptable in engineering practice.

In one embodiment, to test the DUT 200, the DUT 200 may firstly set to emit signals sequentially with all possible steering angles, e.g., −60 degree to 60 degree, and all antenna units 30 of the antenna array 130 may correspondingly receive all these data so as to record all $$\sum_{k=1}^{N} \cos((1 - k)\pi(\sin\theta - \sin\phi))$$

value. Then the emulator system 100 enters the second stage to verify the correctness of the AoA detection. With all $$\sum_{k=1}^{N} \cos((1 - k)\pi(\sin\theta - \sin\phi))$$

data recorded, the emulator system 100 is capable of determining whether the DUT 200 is capable of correctly calculating the AoA.

FIG. 9 illustrates a flowchart of an emulating method for satellite communication according to one embodiment of the present disclosure, wherein the emulating method may be implemented by the emulator system 100 as shown in FIG. 2. In step S901, providing a first antenna array, wherein the first antenna array comprises a plurality of antenna units arranged along a first direction. In step S902, mounting the device under test on a virtual plane by a jig. In step S903, enabling a first beam by the first antenna array. In step S904, steering the first beam to the device under test by a default angle of incidence. In step S905, transmitting a first signal to the device under test via the first beam, and receiving a second signal corresponding to the first signal from the device under test. In step S906, calculating a value of phase difference according to the second signal. In step S907, determining whether the device under test passes a test according to the value of phase difference and a threshold to generate a testing result. In step S908, outputting the testing result.

In summary, the disclosure an emulator system for satellite communication. The emulator system can simulate the conditions where there are multiple satellites in the satellite communication system, where the satellite orbit is not just above the ground terminal, or where the ground terminal itself is moving.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An emulator system for satellite communication, suitable for a device under test, comprising:
   a first antenna array, comprising a plurality of antenna units arranged along a first direction;
   a jig for mounting the device under test on a virtual plane; and
   a controller, communicatively connected to the first antenna array, wherein the controller is configured to:
   enable a first beam by the first antenna array;
   steer the first beam to the device under test by a default angle of incidence;
   transmit a first signal to the device under test via the first beam, and receive a second signal corresponding to the first signal from the device under test, wherein the device under test transmits the second signal toward the first antenna array with a steering angle;
   calculate a value of phase difference between the default angle of incidence and the steering angle;
   determine whether the device under test passes a test of detecting an angle of arrival according to the value of phase difference and a threshold to generate a testing result; and
   output the testing result.

2. The emulator system according to claim 1, wherein a projection of the first antenna array on the virtual plane overlaps with the jig.

3. The emulator system according to claim 1, wherein a projection of the first antenna array on the virtual plane does not overlaps with the jig.

4. The emulator system according to claim 1, wherein the controller enables a second beam different from the first beam by the first antenna array, and communicates with the device under test via the second beam to generate the testing result.

5. The emulator system according to claim 1, further comprising:
   a second antenna array, comprising a plurality of antenna units arranged along a second direction, wherein the second antenna array communicatively connected to the controller, wherein the controller enables the first beam by the first antenna array and the second antenna array.

6. The emulator system according to claim 1, further comprising:
   a second antenna array, comprising a plurality of antenna units arranged along a second direction, wherein the second antenna array communicatively connected to the controller, wherein the controller enables a second beam by the second antenna array, and communicates with the device under test via the second beam to generate the testing result.

7. The emulator system according to claim 1, wherein the first antenna array further comprising:

a phase shifter, electrically connected to a first antenna unit of the plurality of antenna units, wherein the controller performs a phase shifting on the second signal by the phase shifter to obtain a shifted signal, and calculates the value of phase difference according to the shifted signal.

8. The emulator system according to claim 7, wherein the controller further configured to:

receive a calibration signal from the device under test; and compensate the shifted signal according to the calibration signal to calculate the value of phase difference.

9. The emulator system according to claim 1, wherein the controller adjusts a mocked-height of an emulated satellite of the satellite communication by adjusting a signal strength of the first beam.

10. The emulator system according to claim 9, wherein the controller adjusts a mocked angle of incidence by adjusting the default angle of incidence based on the mocked-height.

11. The emulating system according to claim 1, wherein the jig is a movable object and is electrically connected to the controller, wherein the controller configures the jig to make the virtual plane has six degrees of freedom.

12. An emulating method for satellite communication, suitable for a device under test, comprising:

providing a first antenna array, wherein the first antenna array comprises a plurality of antenna units arranged along a first direction;

mounting the device under test on a virtual plane by a jig;

enabling a first beam by the first antenna array;

steering the first beam to the device under test by a default angle of incidence;

transmitting a first signal to the device under test via the first beam, and receiving a second signal corresponding to the first signal from the device under test, wherein the device under test transmits the second signal toward the first antenna array with a steering angle;

calculating a value of phase difference between the default angle of incidence and the steering angle;

determining whether the device under test passes a test of detecting an angle of arrival according to the value of phase difference and a threshold to generate a testing result; and outputting the testing result.

13. The emulating method according claim 12, wherein a projection of the first antenna array on the virtual plane overlaps with the jig.

14. The emulating method according to claim 12, wherein a projection of the first antenna array on the virtual plane does not overlaps with the jig.

15. The emulating method according to claim 12, further comprising:

enabling a second beam different from the first beam by the first antenna array; and communicating with the device under test via the second beam to generate the testing result.

16. The emulating method according to claim 12, further comprising:

providing a second antenna array, wherein the second antenna array comprises a plurality of antenna units arranged along a second direction, wherein the step of enabling the first beam by the first antenna array comprising:

enabling the first beam by the first antenna array and the second antenna array.

17. The emulating method according to claim 12, further comprising:

providing a second antenna array, wherein the second antenna array comprises a plurality of antenna units arranged along a second direction, wherein the step of generating the testing result comprising:

enabling a second beam by the second antenna array; and communicating with the device under test via the second beam to generate the testing result.

18. The emulating method according to claim 12, wherein the step of calculating the value of phase difference according to the second signal comprising:

performing a phase shifting on the second signal to obtain a shifted signal; and calculating the value of phase difference according to the shifted signal.

19. The emulating method according to claim 18, wherein the step of calculating the value of phase difference according to the shifted signal comprising:

receiving a calibration signal from the device under test; and compensating the shifted signal according to the calibration signal to calculate the value of phase difference.

20. The emulating method according to claim 12, further comprising:

adjusting a mocked-height of an emulated satellite of the satellite communication by adjusting a signal strength of the first beam.

\* \* \* \* \*